United States Patent
Huang et al.

(10) Patent No.: US 8,476,004 B2
(45) Date of Patent: Jul. 2, 2013

(54) METHOD FOR FORMING PHOTORESIST PATTERNS

(75) Inventors: Yong-Fa Huang, Tainan (TW); Cheng-Han Wu, Taichung (TW); Yuan-Chi Pai, Tainan (TW); Chun-Chi Yu, Taipei (TW); Hung-Yi Wu, Keelung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 158 days.

(21) Appl. No.: 13/169,045

(22) Filed: Jun. 27, 2011

(65) Prior Publication Data

US 2012/0329280 A1    Dec. 27, 2012

(51) Int. Cl.
*G03F 7/26* (2006.01)

(52) U.S. Cl.
USPC .......................................... 430/395; 430/322

(58) Field of Classification Search
USPC .......................... 430/290, 311, 313, 395, 950
See application file for complete search history.

(56) References Cited

U.S. PATENT DOCUMENTS

| | | | |
|---|---|---|---|
| 5,245,470 A | 9/1993 | Keum | |
| 5,446,669 A | 8/1995 | Yamashita | |
| 5,602,644 A | 2/1997 | Ota | |
| 5,689,339 A | 11/1997 | Ota | |
| 5,716,763 A | 2/1998 | Benoit | |
| 5,807,439 A | 9/1998 | Akatsu | |
| 6,275,744 B1 | 8/2001 | Yoshida | |
| 6,286,524 B1 | 9/2001 | Okuchi | |
| 6,509,971 B2 | 1/2003 | Inoue | |
| 6,566,021 B2 | 5/2003 | Wang | |
| 6,724,463 B2 | 4/2004 | Taniguchi | |
| 6,781,670 B2 | 8/2004 | Krautschik | |
| 6,788,477 B2 | 9/2004 | Lin | |
| 6,795,169 B2 | 9/2004 | Tanaka | |
| 6,815,664 B2 | 11/2004 | Wang | |
| 6,867,844 B2 | 3/2005 | Vogel | |
| 6,891,596 B2 | 5/2005 | Rostalski | |
| 6,979,822 B1 | 12/2005 | Stewart | |
| 7,090,963 B2 | 8/2006 | Medeiros | |
| 7,150,945 B2 | 12/2006 | Mackey | |
| 2004/0157453 A1* | 8/2004 | Delgadino et al. | 438/691 |
| 2005/0048223 A1 | 3/2005 | Pawloski | |
| 2005/0175940 A1 | 8/2005 | Dierichs | |
| 2005/0233081 A1 | 10/2005 | Tokita | |
| 2005/0266354 A1 | 12/2005 | Li | |
| 2006/0023184 A1 | 2/2006 | Coon | |
| 2006/0188804 A1 | 8/2006 | Allen | |
| 2006/0234158 A1* | 10/2006 | Hatakeyama | 430/270.1 |
| 2007/0072090 A1 | 3/2007 | Chang | |
| 2007/0215040 A1 | 9/2007 | Huang | |
| 2008/0067335 A1 | 3/2008 | Hou | |
| 2009/0191723 A1 | 7/2009 | Huang | |

* cited by examiner

*Primary Examiner* — Kathleen Duda
(74) *Attorney, Agent, or Firm* — Winston Hsu; Scott Margo

(57) ABSTRACT

A method for forming photoresist patterns includes providing a substrate, forming a bi-layered photoresist on the substrate, and performing a photolithography process to pattern the bi-layered photoresist. The bi-layered photoresist includes a first photoresist layer and a second photoresist layer positioned between the first photoresist layer and the substrate. The first photoresist layer has a first refraction index and the second photoresist layer has a second refraction index, and the second refraction index is larger than the first refraction index.

16 Claims, 5 Drawing Sheets

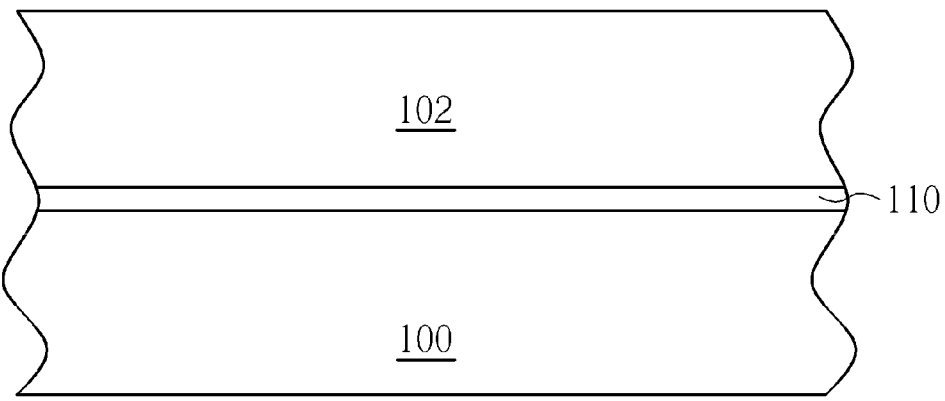
FIG. 1
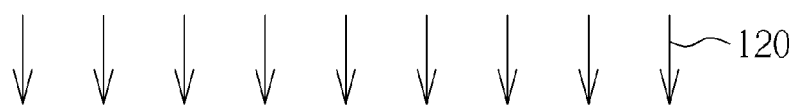
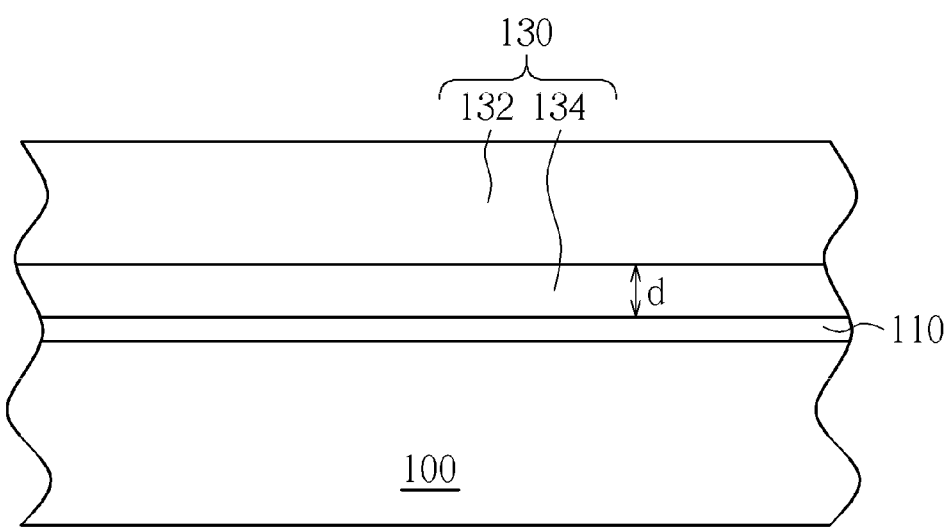
FIG. 2

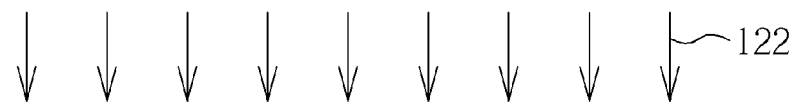
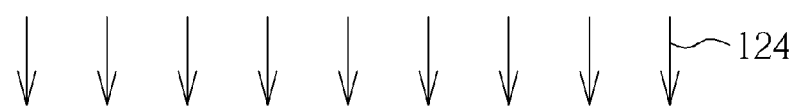
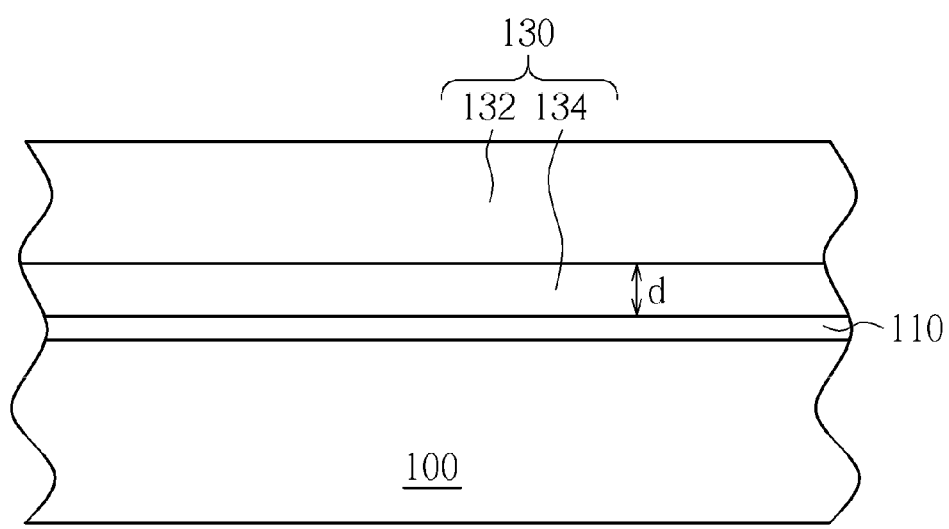

METHOD FOR FORMING PHOTORESIST PATTERNS

BACKGROUND OF THE INVENTION

1. Field of the Invention

The present invention generally relates to a method for forming photoresist patterns, and more particularly, to a method for forming photoresist patterns adopting immersion photolithography.

2. Description of the Prior Art

Photolithography is one of most essential or critical processes in the semiconductor manufacture. The photolithography not only positively influences the process result as well the performance of the ion implantation or etching process but also positively influences the performance and reliability of the final semiconductor devices. Furthermore, the photolithography renders impacts to device integration as well to the progression of semiconductor fabrication. For example, conventional semiconductor fabrication processes typically employ g-line photography having wavelengths of 465 nanometer (nm). And the conventional semiconductor fabrication processes further develop i-line photolithography having wavelengths of 365 nm, 248 nm and 193 nm for fulfilling the requirement of high resolution to the trend of device miniaturization.

However, it is found that as the wavelength becomes shorter, the energy of the provided UV becomes greater and therefore the reflected light from the material under the photoresist is increased. Consequently the reflected UV renders serious interference to the incident UV light and critical dimension (CD) shift is resulted, which forms inaccurate patterns after the photolithography. And the following process such as ion implantation and etching process are adversely impacted.

As a countermeasure against to the abovementioned problems, there has been proposed a multilayered bottom anti-reflective coating (hereinafter abbreviated as BARC) for reducing reflectivity before forming the photoresist. The BARC conventionally includes inorganic materials and is formed as a multilayered structure to provide sufficient ability to reduce UB reflectivity and to avoid thickness control difficulty.

It is well known to those skilled in the art that the BARC is eventually removed as well as the photoresist and followed by other required processes. Therefore it is still in need to provide a method for forming photoresist patterns that is able to reduce the process cost on the temporary BARC without influencing the accuracy of the transferred photoresist patterns.

SUMMARY OF THE INVENTION

According to an aspect of the present invention, a method for forming photoresist patterns is provided. The method includes providing a substrate, forming a bi-layered photoresist on the substrate, and performing a photolithography to pattern the bi-layered photoresist. More important, the bi-layered photoresist includes a first photoresist layer and a second photoresist layer positioned between the first photoresist layer and the substrate. The first photoresist layer has a first refractive index, the second photoresist layer has a second refractive index, and the second refractive index is larger than the first refractive index.

According to the method for forming photoresist patterns of the present invention, the second photoresist layer is provided to replace the conventional multilayered BARC. More important, by adjusting a thickness of the second photoresist layer, a reflected light produced between the second photoresist layer and the substrate causes a destructive interference to a reflected light produced between the first photoresist layer and the second photoresist layer. Therefore reflectivity of the bi-layered photoresist is reduced and interference to an incident light from the reflected lights is consequently reduced. Thus the CD shift issue and the inaccurate pattern transferring problem are both are prevented.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are drawings illustrating a method for forming photoresist patterns provided by a first preferred embodiment of the present invention, wherein FIGS. 3-4 are drawings illustrating a modification of the first preferred embodiment.

DETAILED DESCRIPTION

Figure 5:
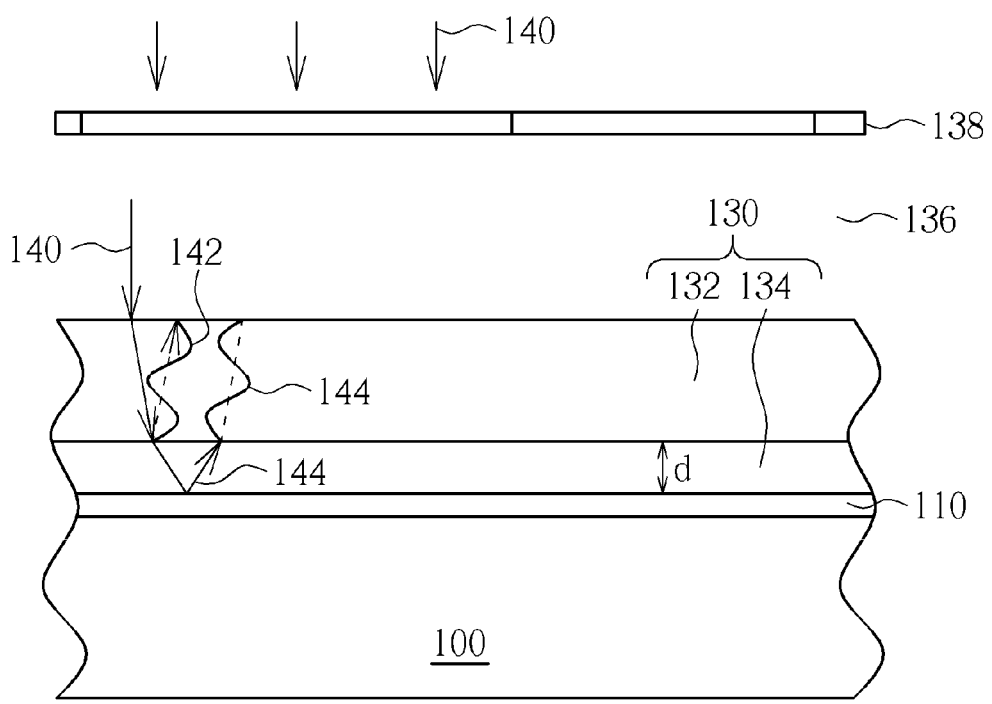

Pease refer to FIGS. 1-6, which are drawings illustrating a method for forming photoresist patterns provided by a first preferred embodiment of the present invention. According to the preferred embodiment, a substrate 100, such as a silicon substrate, a silicon-containing substrate, or a silicon-on-insulator (SOI) substrate is first provided. The substrate 100 can include any required semiconductor devices or metal connections formed therein. And the substrate 100 can include any required layers such as conductive layers, dielectric layers or semi-conductive layers formed thereon. For clarifying the characteristics of the present invention, those devices, interconnections, or layers are omitted from FIG. 1. However, those skilled in art would easily realize that those devices, interconnections, or layers formed in the substrate 100 cannot be ignored in the preferred embodiment.

Please still refer to FIG. 1. Next, a single BARC 110 is formed on the substrate 100. The single BARC 110 is formed to cover the abovementioned devices, interconnections, or layers. And the single BARC 110 includes a thickness between about 500-2000 angstroms (Å). According to the preferred embodiment, the single BARC 110 includes a dielectric material, and the dielectric material can include, for example but not limited to, silicon nitride (SiN) or silicon oxynitride (SiON).

Please refer to FIG. 1 and FIG. 2. Then, a photoresist mixture 102 is formed on the single BARC 110 by spin coating. The photoresist mixture 102 can include photoresist materials having different physical characteristics. For example, the photoresist mixture 102 can include a first photoresist material (not shown) having a first refractive index (n1) and a second photoresist material (not shown) having a second refractive index (n2). It is noteworthy that the second refractive index is larger than the first refractive index. Additionally, the first photoresist material and the second photoresist material are exemplarily negative photoresist materials in the preferred embodiment. Next, a soft baking step 120 is performed to the photoresist mixture 102. Accordingly, a first photoresist layer 132 and a second photoresist layer 134 are automatically delaminated and formed as shown in FIG. 2. Thus a bi-layered photoresist 130 including the first photoresist layer 132 and the second photoresist layer 134 is obtained. As shown in FIG. 2, the second photoresist layer 134 is formed between the first photoresist layer 132 and the substrate 100, more specifically, the second photoresist layer 134 is formed between the first photoresist layer 132 and the single BARC 110. In the preferred embodiment, the first photoresist layer 132 includes the first photoresist material thus inherently includes the first refractive index, the second photoresist layer 134 includes the second photoresist material thus inherently includes the second refractive index.

Please still refer to FIG. 2. The first photoresist layer 132 includes a predetermined thickness which is sufficient to protect layers underneath from etchant during the photolithography or even during the etching process. The second photoresist layer 134 includes a thickness d, which is decided according to a phase shift formula (1) for minimum interference:

$$(4\pi n_f/\lambda_f)d^*\cos\theta_f=(2m+1)\pi$$

$$d^*\cos\theta_f=2m(\lambda_f/4n_f) \quad (1)$$

Wherein $n_f$ indicates the refractive index of the second photoresist layer 134, $\lambda_f$ indicates a wavelength of an incident light employed in the photolithography, $\theta_f$ indicates an incident angle of the incident light, and m indicates a node of the incident light. Since the abovementioned parameters are all fixed values, the phase shift of the incident light is corresponding to the thickness d of the second photoresist layer 134. In other words, by adjusting the thickness d of the second photoresist layer 134, a reflected light between the second photoresist layer 134 and the single BARC 110 obtains a phase shift. Accordingly, the thickness d of the second photoresist layer 134 is between 1000-4500 Å in the preferred embodiment.

Please refer to FIGS. 3-4, which are drawings illustrating a modification of the first preferred embodiment. For accurately and precisely controlling the predetermined thickness of the first photoresist layer 132 and the thickness d of the second photoresist layer 134, the modification is to form a photoresist material having the second refractive index on the single BARC 110 by spin coating and sequentially performs a soft baking step 122, thus the second photoresist layer 134 having the thickness d is obtained. Next, another photoresist material having the first refractive index is formed on the second photoresist layer 134 by spin coating and followed by performing a soft baking step 124. Thus the first photoresist layer 132 is formed, and accordingly the bi-layered photoresist 130 upwardly including the second photoresist layer 134 and the first photoresist layer 132 is obtained as shown in FIG. 4.

Please refer to FIG. 5. After forming the bi-layered photoresist 130 that is obtained by performing the steps depicted as shown in FIGS. 1-2 or by performing the steps depicted as shown in FIGS. 3-4, a photolithography is performed. It is well-known to those skilled in the art that the photolithography typically includes an exposure step and a development step. In the exposure step, an incident light 140 such as an i-line UV having a wavelength about 248 nm or 193 nm is used to irradiate the bi-layered photoresist 130 through a mask 138. It is noteworthy that the surface of the bi-layered photoresist 130, that is the surface of the first photoresist layer 132 contacts an ambient medium 136. The ambient medium 136 includes a third refractive index that is smaller than the first refractive index of the first photoresist layer 134. The ambient medium 136 can be vacuum, air, nitrogen gas, or inert gas. More important, since the photolithography preferably is an immersion photolithography according to the preferred embodiment, the ambient medium 136 preferably includes water.

Please still refer to FIG. 5. During the exposure step, the incident light 140 produces a first reflected light 142 between the first photoresist layer 132 and the second photoresist layer 134, and a second reflected light 144 between the second photoresist layer 134 and the single BARC 110. As mentioned above, by adjusting the thickness d of the second photoresist layer 134, the second reflected light 144 produced between the second photoresist layer 134 and the single BARC 110 obtains a phase shift, and immediately enters the first photoresist layer 132. Therefore, the second reflected light 144 and the first reflected light 142 have a phase shift of about 180 degrees (°). Accordingly, the second reflected light 144 causes a destructive interference to the first reflected light 142 and therefore reduces the first reflected light 142. It is noteworthy that for emphasizing the phase shift between the first reflected light 142 and the second reflected light 144, the directions of the first reflected light 142 and the second reflected light 144 in the first photoresist layer 132 are depicted by the dashed line as shown in FIG. 5. More important, only a set of the first reflected light 142 and the second reflected light 144 produced by the incident light 140 are shown in FIG. 5 in order to avoid confusion.

Figure 6:
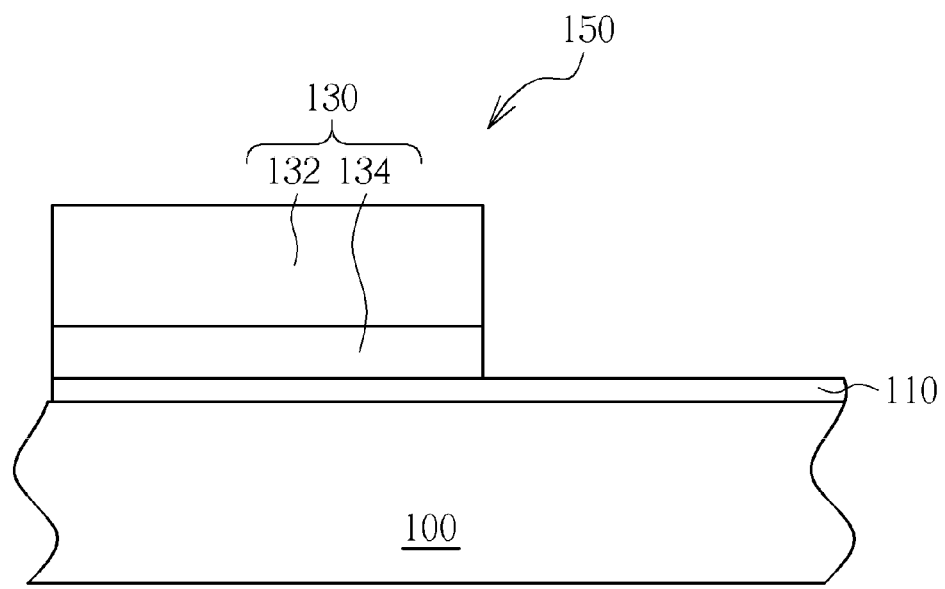

Please refer to FIG. 6. After the exposure step, a development step and a hard baking step are sequentially performed. As mentioned above, the bi-layered photoresist 130 provided by the preferred embodiment includes negative photoresist materials, therefore portions of the bi-layered photoresist 130 that are exposed in the exposure step are remained, while the other portions are removed. Consequently, photoresist patterns 150 are formed on the substrate 100 as shown in FIG. 6 and processes typically required in the semiconductor fabrication such as etching process is following performed. However, those skilled in the art would realize when the photoresist material used in the preferred embodiment includes positive photoresist materials, the portions exposed in the exposure step are removed while the shielded portions are remained after the development step and the hard baking step, and thus patterns (not shown) complementary to the photoresist patterns 150 shown in FIG. 6 are formed on the substrate 100.

According to the method for forming photoresist patterns provided by the first preferred embodiment, the second reflected light 144 produced between the second photoresist layer 134 and the single BARC 110 causes a destructive interference to the first reflected light 142 produced between the first photoresist layer 132 and the second photoresist layer 134 by adjusting the thickness d of the second photoresist layer 134. Therefore reflectivity of the bi-layered photoresist 130 is reduced and the interference to the incident light 140 from the first reflected light 142 is consequently reduced. Accordingly, the second photoresist layer 134 is positioned to replace the multilayered BARC that is required in the conventional photolithography, and thus only the single BARC 110 is required. More important, the bi-layered photoresist 130 is provided to avoid interference between the first reflected light 142 and the incident light 140, thus the CD shift issue and the inaccurate pattern transferring problem are both are prevented.

Figure 7:
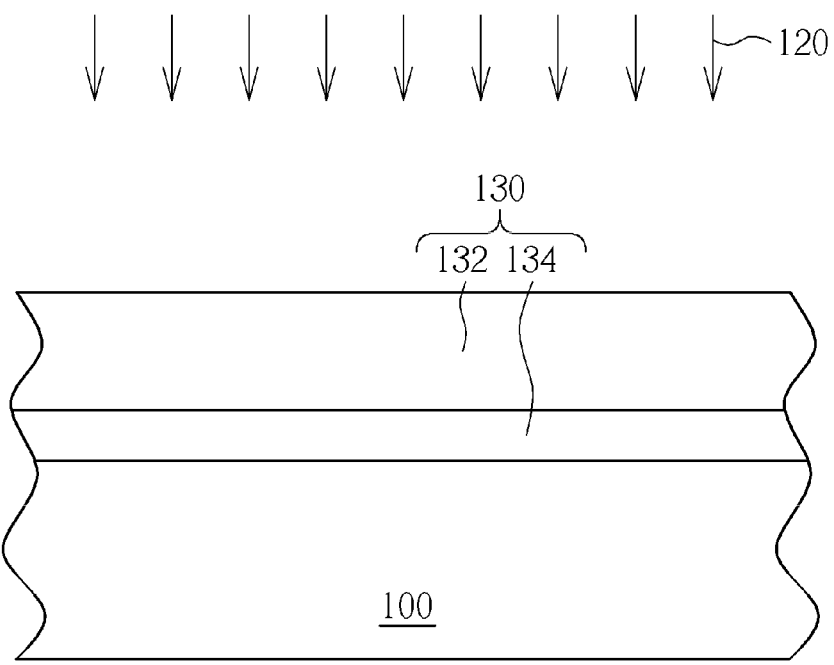
FIGS. 7-9 are drawings illustrating a method for forming photoresist patterns provided by a second preferred embodiment of the present invention.
Figure 8:
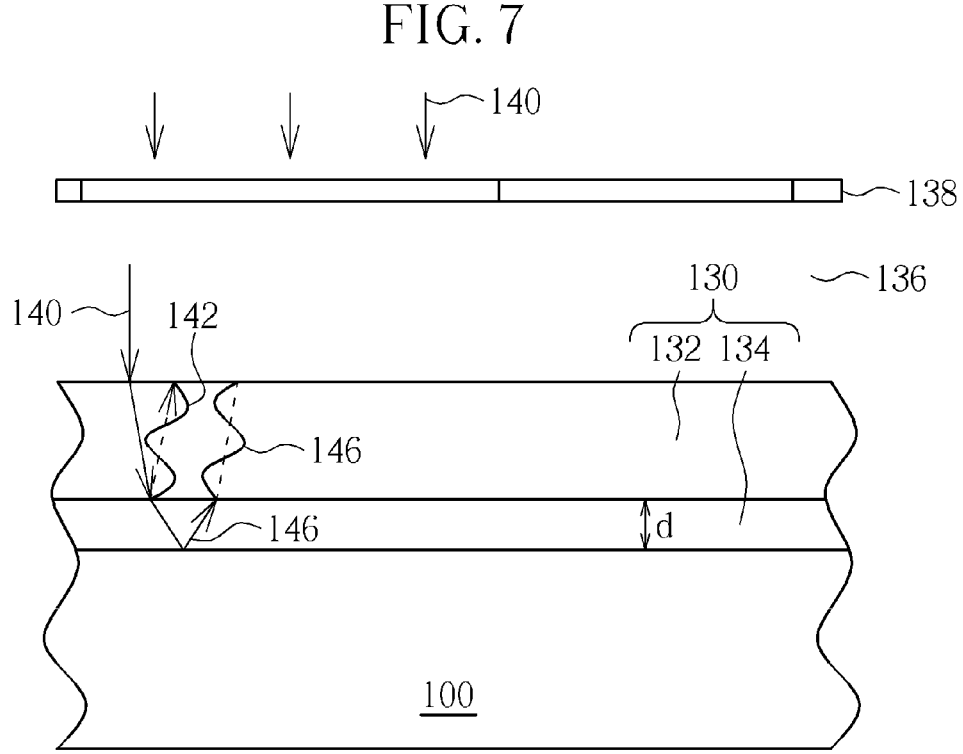
Figure 9:
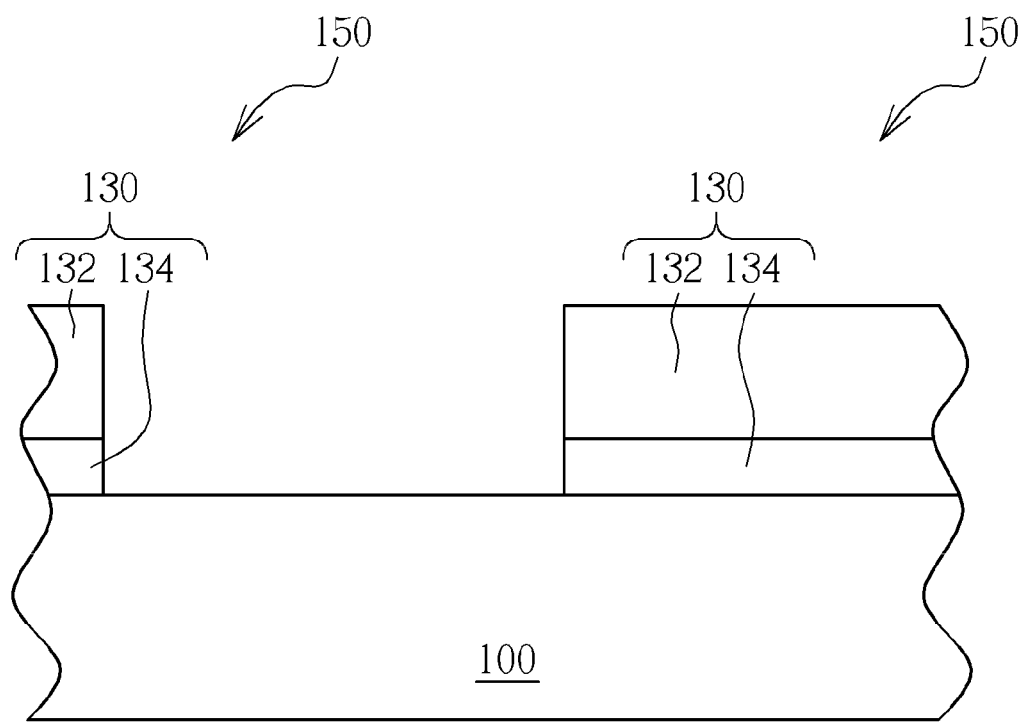

Please refer to FIGS. 7-9, which are drawings illustrating a method for forming photoresist patterns provided by a second preferred embodiment of the present invention. It should be noted that elements the same in both first and second preferred embodiment are designated by the same numerals. According to the preferred embodiment, a substrate 100 such as a silicon substrate, a silicon-containing substrate, or SOI substrate is first provided. More important, an ion implantation is to be performed to the substrate 100 in the preferred embodiment. Therefore, photoresist patterns are required on the substrate 100 for exposing portions of the substrate 100 for forming doped region and for shielding portions of the substrate 100 for preventing such portions from the ion implantation. It is well-known to those skilled in the art that the silicon substrate has a mirror surface, and thus a great deal of reflected lights is produced and serious CD shift issue is resulted. However, any BARC formed on the substrate 100 renders adverse impact to the results of the ion implantation such as forming doped region does not have expected profiles.

Therefore, the preferred embodiment is to form a photoresist mixture (not shown) directly on the substrate 100 by spin coating. As mentioned above, the photoresist mixture can include photoresist materials having different physical characteristics. For example, the photoresist mixture can include a first photoresist material (not shown) having a first refractive index (n1) and a second photoresist material (not shown) having a second refractive index (n2). It is noteworthy that the second refractive index is larger than the first refractive index. Additionally, the first photoresist material and the second photoresist material are exemplarily positive photoresist materials in the preferred embodiment. Next, a soft baking step 120 is performed to the photoresist mixture. Accordingly, a first photoresist layer 132 and a second photoresist layer 134 are automatically delaminated and formed as shown in FIG. 7. Thus a bi-layered photoresist 130 including the first photoresist layer 132 and the second photoresist layer 134 is obtained. As shown in FIG. 7, the second photoresist layer 134 is formed between the first photoresist layer 132 and the substrate 100. In the preferred embodiment, the first photoresist layer 132 includes the first photoresist material thus inherently includes the first refractive index, and the second photoresist layer 134 includes the second photoresist material thus inherently includes the second refractive index.

As mentioned above, the first photoresist layer 132 includes a predetermined thickness which is sufficient to protect layers underneath from etchant during the photolithography or even during the etching process. The second photoresist layer 134 includes a thickness d, which is decided according to a phase shift formula (1) as mentioned above. Since the phase shift of the incident light is corresponding to the thickness d of the second photoresist layer 134, a reflected light between the second photoresist layer 134 and the single BARC 110 obtains a phase shift by adjusting the thickness d of the second photoresist layer 134. Accordingly, the thickness d of the second photoresist layer 134 is between 1000-4500 Å in the preferred embodiment. In addition, for accurately and precisely controlling the predetermined thickness of the first photoresist layer 132 and the thickness d of the second photoresist layer 134, the second photoresist layer 134 and the first photoresist layer 132 can be sequentially formed on the substrate 100 by performing the spin coating step and the subsequent soft baking step as mentioned in the above modification.

Please refer to FIG. 8. After forming the bi-layered photoresist 130, a photolithography is performed. It is well-known to those skilled in the art that the photolithography typically includes an exposure step and a development step. In the exposure step, an incident light 140 such as an i-line UV having a wavelength about 248 nm or 193 nm is used to irradiate the bi-layered photoresist 130 through a mask 138. As mentioned above, the surface of the bi-layered photoresist 130, that is the surface of the first photoresist layer 132 contacts an ambient medium 136. The ambient medium 136 includes a third refractive index that is smaller than the first refractive index of the first photoresist layer 134. The ambient medium 136 can be vacuum, air, nitrogen gas, or inert gas. More important, since the photolithography preferably is an immersion photolithography according to the preferred embodiment, the ambient medium 136 preferably includes water.

Please still refer to FIG. 8. During the exposure step, the incident light 140 produces a first reflected light 142 between the first photoresist layer 132 and the second photoresist layer 134, and a second reflected light 146 between the second photoresist layer 134 and the substrate 100. As mentioned above, by adjusting the thickness d of the second photoresist layer 134, the second reflected light 146 produced between the second photoresist layer 134 and the substrate 100 obtains a phase shift, and immediately enters the first photoresist layer 132. Therefore, the second reflected light 146 and the first reflected light 142 have a phase shift of about 180°. Accordingly, the second reflected light 146 causes a destructive interference to the first reflected light 142 and reduces the first reflected light 142. It is noteworthy that for emphasizing the phase shift between the first reflected light 142 and the second reflected light 146, the directions of the first reflected light 142 and the second reflected light 146 in the first photoresist layer 132 are depicted by the dashed line as shown in FIG. 8. More important, only a set of the first reflected light 142 and the second reflected light 146 produced by the incident light 140 are shown in FIG. 8 in order to avoid confusion.

Please refer to FIG. 9. After the exposure step, a development step and a hard baking step are sequentially performed. As mentioned above, the bi-layered photoresist 130 provided by the preferred embodiment includes positive photoresist materials, therefore portions of the bi-layered photoresist 130 that are exposed in the exposure step are removed, while the other portions are remained. Consequently, photoresist patterns 150 are formed on the substrate 100 as shown in FIG. 9 and ion implantation is following performed to form doped regions. However, those skilled in the art would realize when the photoresist material used in the preferred embodiment includes negative photoresist materials, the portions exposed in the exposure step are remained while the shielded portions are removed after the development step and the hard baking step, and thus patterns (not shown) complementary to the photoresist patterns 150 shown in FIG. 9 are formed on the substrate 100.

According to the method for forming photoresist pattern provided by the second preferred embodiment, the second reflected light 146 produced between the second photoresist layer 134 and the substrate 100 causes a destructive interference to the first reflected light 142 produced between the first photoresist layer 132 and the second photoresist layer 134 by adjusting the thickness d of the second photoresist layer 134. Therefore reflectivity of the bi-layered photoresist 130 is reduced and the interference to the incident light 140 from the first reflected light 142 is consequently reduced. More important, the bi-layered photoresist 130 provided by the preferred embodiment efficiently reduces the reflectivity even the substrate 100 has a mirror surface and the BARC conventionally used to reduces reflectivity cannot formed on the substrate 100. In other words, since the bi-layered photoresist 130 is provided to avoid interference between the first reflected light 142 and the incident light 140, the CD shift issue and the inaccurate pattern transferring problem are both are prevented.

According to the method for forming photoresist patterns of the present invention, the second photoresist layer is provided to replace the conventional multilayered BARC. More important, by adjusting a thickness of the second photoresist layer, a reflected light produced between the second photoresist layer and the substrate causes a destructive interference to a reflected light produced between the first photoresist layer and the second photoresist layer. Therefore reflectivity of the bi-layered photoresist is reduced and interference to an incident light from the reflected lights is consequently reduced. Thus the CD shift issue and the inaccurate pattern transferring problem are both are prevented.

Those skilled in the art will readily observe that numerous modifications and alterations of the device and method may be made while retaining the teachings of the invention.

What is claimed is:

1. A method for forming photoresist patterns comprising:
   providing a substrate;
   forming a bi-layered photoresist on the substrate, the bi-layered photoresist comprising a first photoresist layer and a second photoresist layer positioned between the first photoresist layer and the substrate, the first photoresist layer having a first refractive index, the second photoresist layer having a second refractive index, and the second refractive index is larger than the first refractive index, wherein a thickness of the second photoresist layer is decided according to a formula (1):

$$(4\pi n_f/\lambda_f)d^*\cos\theta_i = (2m+1)\pi \quad (1)$$

wherein $n_f$ is the second refractive index of the second photoresist layer, $\lambda_f$ is a wavelength of an incident light, d is the thickness of the second photoresist layer, $\theta_i$ is an incident angle of the incident light, and m is a node of the incident light; and
   performing a photolithography to pattern the bi-layered photoresist.

2. The method for forming photoresist patterns according to claim 1, wherein the substrate further comprises a single bottom anti-reflective coating (BARC) formed between the bi-layered photoresist and the substrate.

3. The method for forming photoresist patterns according to claim 2, further comprising exposing the bi-layered photoresist with an incident light to produce a first reflected light between the first photoresist layer and the second photoresist layer and a second reflected light between the second photoresist layer and the single BARC, the first reflected light and the second reflected light have a phase difference and the second reflected light such that the second reflected light causes a destructive interference to the first reflected light.

4. The method for forming photoresist patterns according to claim 2, wherein the single BARC comprises a thickness between 500-2000 angstroms (Å).

5. The method for forming photoresist patterns according to claim 2, wherein the single BARC comprises a dielectric material.

6. The method for forming photoresist patterns according to claim 5, wherein the dielectric material comprises silicon nitride (SiN) or silicon oxynitride (SiON).

7. The method for forming photoresist patterns according to claim 1, wherein the second photoresist layer comprises a thickness between 1000-4500 angstroms.

8. The method for forming photoresist patterns according to claim 1, wherein the first photoresist layer comprises a predetermined thickness.

9. The method for forming photoresist patterns according to claim 1, wherein the step of forming bi-layered photoresist further comprises:
   spin coating a photoresist mixture on the substrate; and
   performing a soft baking step to the photoresist mixture such that the first photoresist layer and the second photoresist layer are automatically delaminated and formed.

10. The method for forming photoresist patterns according to claim 1, wherein the step of forming the bi-layered photoresist further comprises:
    spin coating a first photoresist material on the substrate;
    performing a first soft baking step to form the second photoresist layer;
    spin coating a second photoresist material on the substrate; and
    performing a second soft baking step to form the first photoresist layer.

11. The method for forming photoresist patterns according to claim 1, wherein the photolithography further comprises performing an exposure step to irradiate the bi-layered photoresist with an incident light.

12. The method for forming photoresist patterns according to claim 11, wherein the incident light produces a first reflected light between the first photoresist layer and the second photoresist layer and a second reflected light between the second photoresist layer and the substrate, the first reflected light and the second reflected light have a phase difference such that the second reflected light causes a destructive interference to the first reflected light.

13. The method for forming photoresist patterns according to claim 11, wherein the photolithography further comprises performing a development step and a hard baking step sequentially.

14. The method for forming photoresist patterns according to claim 1, wherein the first photoresist layer contacts an ambient medium.

15. The method for forming photoresist patterns according to claim 14, wherein the ambient medium comprises a third refractive index and the third refractive index is smaller than the first refractive index of the first photoresist layer.

16. The method for forming photoresist patterns according to claim 15, wherein the ambient medium comprises air, nitrogen gas, inert gas, or water.

* * * * *